United States Patent
Murakami et al.

(10) Patent No.: US 10,827,436 B2
(45) Date of Patent: Nov. 3, 2020

(54) BASE STATION AND METHOD OF CONTROLLING TRANSMISSION/RECEPTION POWER

(71) Applicant: NIPPON TELEGRAPH AND TELEPHONE CORPORATION, Tokyo (JP)

(72) Inventors: Tomoki Murakami, Yokosuka (JP); Koichi Ishihara, Yokosuka (JP); Yasushi Takatori, Yokosuka (JP); Hirantha Abeysekera, Yokosuka (JP); Mamoru Akimoto, Yokosuka (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 16/480,075

(22) PCT Filed: Jan. 25, 2018

(86) PCT No.: PCT/JP2018/002296
§ 371 (c)(1),
(2) Date: Jul. 23, 2019

(87) PCT Pub. No.: WO2018/139540
PCT Pub. Date: Aug. 2, 2018

(65) Prior Publication Data
US 2019/0387482 A1     Dec. 19, 2019

(30) Foreign Application Priority Data
Jan. 27, 2017    (JP) ................................ 2017-013221

(51) Int. Cl.
*H04W 52/14*     (2009.01)
*H04W 52/24*     (2009.01)
(Continued)

(52) U.S. Cl.
CPC ......... *H04W 52/245* (2013.01); *H04W 16/28* (2013.01); *H04W 52/143* (2013.01);
(Continued)

(58) Field of Classification Search
CPC ..... H04W 16/28; H04W 52/04; H04W 52/30; H04W 52/14; H04W 52/143;
(Continued)

(56) References Cited

U.S. PATENT DOCUMENTS

2005/0128970 A1    6/2005   Tsien et al.
2006/0234663 A1    10/2006   Wilhoyte et al.
(Continued)

FOREIGN PATENT DOCUMENTS

JP    2011-188497 A    9/2011
JP    2012-222379 A    11/2012

OTHER PUBLICATIONS

Vivek P. Mhatre, et al.; "Interference Mitigation through Power Control in High Density 802.11 WLANs"; IEEE Infocom 2007 Proceedings, 2007.
(Continued)

*Primary Examiner* — Philip Sobutka
(74) *Attorney, Agent, or Firm* — Harness, Dickey & Pierce, P.L.C.

(57) ABSTRACT

Provided are n antennas and n power change units; a power control unit; a power change management unit managing a common power change amount and an individual power change amount; a common power notification unit notifying the power control unit of the common power change amount in accordance with a target terminal; an individual power notification unit notifying the power control unit in advance of the individual power change amount in accordance with the each terminal at a prescribed timing, in which the power control unit stores the individual power change amount in a
(Continued)

storage unit, and performs control of power changing by adding up the common power change amount in accordance with the target terminal, which is notified from the common power notification unit, and the individual power change amount.

8 Claims, 7 Drawing Sheets

(51) Int. Cl.
    *H04W 52/30*     (2009.01)
    *H04W 88/08*     (2009.01)
    *H04W 16/28*     (2009.01)
    *H04W 52/36*     (2009.01)
    *H04W 84/12*     (2009.01)

(52) U.S. Cl.
    CPC ........... *H04W 52/36* (2013.01); *H04W 88/08* (2013.01); *H04W 84/12* (2013.01)

(58) Field of Classification Search
    CPC ... H04W 52/245; H04W 52/36; H04W 84/12; H04W 88/08
    USPC ........................................................ 455/522
    See application file for complete search history.

(56) References Cited

U.S. PATENT DOCUMENTS

| | | | |
|---|---|---|---|
| 2008/0192702 A1* | 8/2008 | Song | H04W 52/265 370/332 |
| 2011/0223958 A1 | 9/2011 | Chen et al. | |
| 2014/0153536 A1* | 6/2014 | Ouchi | H04L 5/0037 370/329 |
| 2018/0027508 A1* | 1/2018 | Tanaka | H04W 52/245 370/338 |

OTHER PUBLICATIONS

International Search Report (in English and Japanese) issued in International Application No. PCT/JP2018/002297, dated Apr. 17, 2018; ISA/JP.

Taiwanese Office Action (in English and Tawianese) issued in Taiwanese Patent Application No. 107102908, dated Nov. 1, 2018.

International Preliminary Report on Patentability regarding PCT/JP2018/002296, including the English translation of the Written Opinion, dated Aug. 8, 2019.

\* cited by examiner

TX/RX : TRANSMISSION AND RECEPTION UNIT

FIG. 2

| terminal 20-1 | antenna | | | |
|---|---|---|---|---|
| | 11-1 | 11-2 | ... | 11-n |
| reception power of antenna (dBm) | −50 | −40 | ... | −55 |
| common power change amount (dB) : reception power of one reference antenna − threshold(−60dBm) | +10 | | | |
| individual power change amount (dB) : reception power of any antenna − reception power of one reference antenna | 0 | +10 | ... | −5 |

| terminal | common power change amount of power change units 12-1~12-4 | individual power change amount | | | |
|---|---|---|---|---|---|
| | | 12-1 | 12-2 | ... | 12-n |
| 20-1 | +10dB | 0dB | +10dB | ... | −5dB |
| 20-2 | +5dB | 0dB | +3dB | ... | −10dB |
| ⋮ | ⋮ | ⋮ | ⋮ | ⋮ | ⋮ |
| 20-m | +30dB | 0dB | +5dB | ... | +5dB |

⇩

(2)

| terminal | | power change amount | | | |
|---|---|---|---|---|---|
| | | 12-1 | 12-2 | ... | 12-n |
| 20-1 | | +10dB | +20dB | ... | +5dB |
| 20-2 | | +5dB | +8dB | ... | −5dB |
| ⋮ | | ⋮ | ⋮ | ⋮ | ⋮ |
| 20-m | | +30dB | +35dB | ... | +35dB |

F I G. 6

(1) TERMINALS 20-1, 20-2

|  | antenna | | | |
|---|---|---|---|---|
|  | 11-1 | 11-2 | ... | 11-n |
| 20-1 : reception power (dBm) | −50 | −40 | ... | −45 |
| 20-2 : reception power (dBm) | −55 | −50 | ... | −30 |
| minimum reception power (dBm) | −55 | −50 |  | −45 |
| common power change amount (dB) : reception power of one reference antenna − threshold(-60dBm) | +5 | | | |
| individual power change amount (dB) : reception power of any antenna − reception power of one reference antenna | 0 | +5 | ... | +10 |

(2) TERMINALS 20-1, 20-2, 20-3

|  | antenna | | | |
|---|---|---|---|---|
|  | 11-1 | 11-2 | ... | 11-n |
| 20-1 : reception power (dBm) | −50 | −40 | ... | −45 |
| 20-2 : reception power (dBm) | −55 | −50 | ... | −30 |
| 20-3 : reception power (dBm) | −45 | −55 | ... | −50 |
| minimum reception power (dBm) | −55 | −55 |  | −50 |
| common power change amount (dB) : reception power of one reference antenna − threshold(-60dBm) | +5 | | | |
| individual power change amount (dB) : reception power of any antenna − reception power of one reference antenna | 0 | 0 | ... | +5 |

TX/RX : TRANSMISSION AND RECEPTION UNIT

PRIOR ART
FIG. 9
(1) parallel
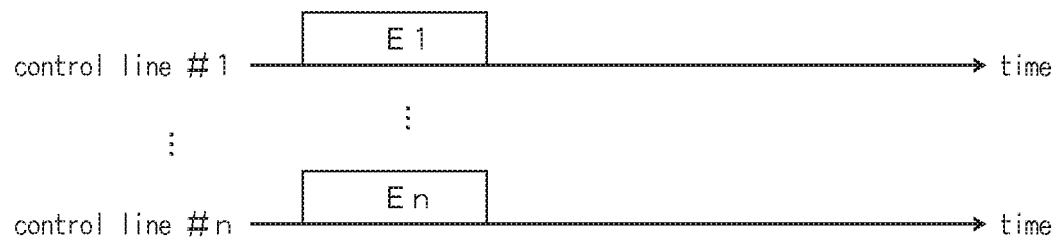
(2) series
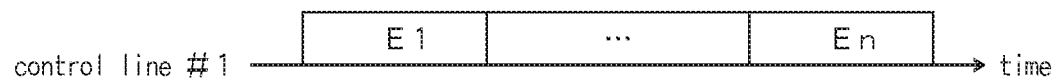

BASE STATION AND METHOD OF CONTROLLING TRANSMISSION/RECEPTION POWER

CROSS REFERENCE TO RELATED APPLICATIONS

This application is a U.S. National Stage Application claiming the benefit of prior filed International Application No. PCT/JP2018/002296 filed on Jan. 25, 2018, in which the International Application claims priority from Japanese Patent Application No. 2017-013221, filed on Jan. 27, 2017. The entire disclosures of the above applications are incorporated herein by reference.

TECHNICAL FIELD

The present invention relates to a base station that performs wireless communication by sharing the same frequency channel with one or more terminals using multiple antennas and that controls a transmission power or a reception power of each antenna and thus improves throughput, and a method of controlling the transmission power or the reception power.

BACKGROUND ART

In recent years, with the spread of a high-performance portable wireless terminal, such as a smartphone, wireless LANs in compliance with the IEEE 802.11 standard have come into wide use not only in companies and public spaces, but also in ordinary houses. As the wireless LANs in compliance with the IEEE 802.11 standard, there are a wireless LAN in compliance with the IEEE 802.11b/g/n standard that uses a 2.4 GHz band, and a wireless LAN in compliance with the IEEE 802.11a/n/ac standard that uses a 5 GHz band.

In the wireless LAN in compliance with the IEEE 802.11b standard or the IEEE 802.11g standard, 13 channels are prepared at intervals of 5 MHz in a bandwidth of 2400 MHz to 2483.5 MHz. However, when using multiple channels in the same place, in order to avoid interference, channels that are not in the same band are used. In such a case, a maximum of three channels are used, and up to four channels can be used at the same time, depending on the place where the channels are used.

In the wireless LAN in compliance with the IEEE 802.11a standard, in Japan, it is stipulated that 8 channels in bands that do not overlap in a bandwidth of 5170 MHz to 5330 MHz and 11 channels in bands that do not overlap in a bandwidth of 5490 MHz to 5710 MHz, totaling 19 channels, should be used. It is noted that in the IEEE 802.11a standard, a bandwidth per channel is set to 20 MHz.

A maximum transfer speed in the wireless LAN is 11 Mbps in the IEEE 802.11b standard and is 54 Mbps in the IEEE 802.11a standard or the IEEE 802.11g standard. However, the transfer speed here is a transfer speed on a physical layer. Actually, because a transfer efficiency in the Medium Access Control (MAC) layer is actually approximately 50 to 70%, an upper limit value of actual throughput is approximately 5 Mbps in the IEEE 802.11b standard and is approximately 30 Mbps in the IEEE 802.11a standard or the IEEE 802.11g standard. Furthermore, if the number of base stations or wireless terminals that are going to transmit information increases, the transfer speed further decreases.

For this reason, in the IEEE 802.11n standard that results from completion of the standardization in 2009, a channel bandwidth was broadened from 20 MHz, which had been set up to that time, to a maximum of 40 MHz, and the introduction of the Multiple input multiple output (MIMO) technology was determined. When all functions that are stipulated in the IEEE 802.11n standard are applied, and thus transmission or reception is performed, it is possible that, in a physical layer, a communication speed of a maximum of 600 Mbps is realized.

Moreover, in the IEEE 802.11ac standard that results from completion of the standardization in 2013, a channel bandwidth was broadened to 80 MHz or a maximum of 160 MHz, or the introduction of the multi-user MIMO (MU-MIMO) transmission scheme to which Space Division Multiple Access (SDMA) is applied was determined. When all functions that are stipulated in the IEEE 802.11ac standard are applied, and thus the transmission or reception is performed, it is possible that, in the physical layer, a communication speed of a maximum of approximately 6.9 Gbps is realized.

In this manner, in the wireless LAN, the communication speed that accompanies the development in the standard that results from the standardization was improved. However, if the same frequency channel is shared among multiple wireless station, it is known that throughput decreases due to a decrease in the number of communication opportunities that accompanies an increase in the number of wireless stations. In contrast to this, a technology is studied in which a power that caused interference to each wireless station is suppressed by adaptively controlling a transmission power of a wireless station conforming with a situation of a communication partner, and in which, as a result, the number of opportunities of each wireless station to perform communication is increased (Non-Patent Document 1: Vivek P. Mhatre, Konstantina Papagiannaki, and Francois Baccelli. "Interference Mitigation through Power Control in High Density 802.11 WLANs", IEEE INFOCOM 2007-26th IEEE International Conference on Computer Communications. IEEE, 2007). Examples of a method of controlling a transmission power include a method of controlling amplitude of a transmission signal using a power adjustment apparatus such as a variable resistor or a variable amplifier.

FIG. 7 illustrates an example of a configuration of a wireless communication system.

In FIG. 7, base stations 10-1 and 10-2 that are connected to a network 30 are configured to use the same frequency channel, and perform wireless communication with terminals 20 under the control of the base stations 10-1 and 10-2, respectively. Furthermore, each of the base stations 10-1 and 10-2 includes multiple antennas, and is configured to perform MIMO communication with one or multiple terminals 20. Moreover, the base stations 10-1 and 10-2 also include a function of adjusting a transmission or reception power of each antenna according to the terminal that is a destination. Furthermore, in an external control apparatus 40 that is connected in the network 30, in some cases, reception power information in each antenna in the base stations 10-1 and 10-2 is collected, and control is performed that is necessary for designation of a frequency channel or adjustment of the transmission or reception power in each antenna in the base stations 10-1 and 10-2.

FIG. 8 illustrates an example of a configuration of a base station in the related art.

In FIG. 8, the base station includes n (n is an integer of two or more) antennas 11-1 to 11-$n$, power change units 12-1 to 12-$n$ that change a transmission power or a reception power of a signal that is transmitted or received in each antenna, transmission and reception units 13-1 to 13-$n$ that perform transmission processing and reception processing of the signal that is transmitted or received, in each antenna, a signal processing control unit 14 that performs conversion processing of a signal that is input or output into or from a network that is connected to the base station, and the signal that is transmitted or received in each antenna, a power notification unit 15 that outputs a notification signal that includes an amount of power change by each of the power change units 12-1 to 12-*n* in accordance with a target terminal that is a destination or source of the signal that is transmitted or received in each antenna, and a power control unit 16 that performs control of power changing by the power change units 12-1 to 12-*n* according to the notification signal.

The power notification unit 15 extracts transmission power information that corresponds to each antenna for the target terminal, before performing the transmission processing, and notifies the power control unit 16 of the transmission power information that corresponds to each antenna. According to the notification signal from the power notification unit 15, the power control unit 16 performs control in such a manner that the transmission powers are changed by the power change units 12-1 to 12-*n* that correspond to the antennas 11-1 to 11-*n*, respectively. The same is true for the control of the reception power of a reception signal. Accordingly, because optimal transmission power control is performed on the target terminal, it is possible that a power that causes interference to any other wireless station is suppressed at the same time and that the number of opportunities for the entire wireless communication system to perform communication is increased. Thus, an improvement in throughput is expected.

DISCLOSURE

Problems to be Solved

The power control unit 16 performs control in such a manner that powers of signals that are transmitted or received in the antennas 11-1 to 11-*n*, respectively, according to the target terminal are changed by the power change units 12-1 to 12-*n*, respectively, of the base station that is illustrated in FIG. 8. At this point, the amount of power change that corresponds to each antenna is generated in the power notification unit 15 of the signal processing control unit 14 according to the target terminal and the generated amount of power change is notified to the power control unit 16. As schemes for transfer of the notification signal that notifies the amount of power change that corresponds to each antenna, the following two methods are considered.

In a first scheme for the transfer of the notification signal, as illustrated in (1) of FIG. 9, amount E1 to En of power change for controlling the power change units 12-1 to 12-*n*, using n control lines, respectively, are notified in parallel. In this case, the amounts E1 to En of power change can be notified in a short time from the power notification unit 15 to the power control unit 16, and changing of the power of the signal that is transmitted or received in each antenna is realized at a high speed. However, because the n control lines are necessary, a problem of increasing a circuit scale and the cost occurs. Moreover, if the number of antennas of the base station increases greatly in the future, there is a need to solve this problem.

In a second scheme for the transfer of the notification signal, as illustrated in (2) of FIG. 9, the amounts E1 to En of power change for controlling the power change units 12-1 to 12-*n*, using one control line, respectively, are notified in series. In this case, the number of control lines can be 1, but, depending on the number n of antennas, it takes time to notify the amounts E1 to En of power change. For example, there is a need to perform control to the precision of milliseconds or less to perform transmission power control on a per-wireless packet basis, and a problem of shortening the transfer time of the notification signal occurs.

A proposition of the present invention is to provide a base station that is capable not only of at a high speed performing changing processing of transmission powers or reception powers of signals that are transmitted or received in multiple antennas, respectively, but also of realizing the changing processing using a few control lines, and a method of controlling a transmission or reception power.

Means for Solving the Problems

According to a first invention, there is provided a base station in a wireless communication system in which the base station and one or more terminals share the same frequency channel, the base station includes n antennas, where n is an integer of two or more; n power change units changing transmission powers or reception powers of signals transmitted or received in the n antennas, respectively; a power control unit performing control of power changing by the n power change units; a power change management unit managing a common power change amount that is common to the antennas, which corresponds to a prescribed reception power, and an individual power change amount that corresponds to a difference between a reception power of each antenna and the prescribed reception power, according to the reception powers of the signals received from each terminal to the n antennas, respectively; a common power notification unit notifying the power control unit of the common power change amount in accordance with a target terminal being a destination or source of a signal before the signals are transmitted or received in the n antennas, respectively; and an individual power notification unit notifying the power control unit in advance of the individual power change amount in accordance with the each terminal at a prescribed timing, in which the power control unit is configured to store the individual power change amount, which is notified in advance by the individual power notification unit, in a storage unit, and to perform control of power changing by the n power change units, using an amount of power change that results from adding up the common power change amount in accordance with the target terminal, which is notified from the common power notification unit, and the individual power change amount in accordance with the target terminal, which is read from the storage unit.

In the base station according to the first invention, the power change management unit may be configured to use as the prescribed reception power, a reception power of one random antenna of the n antennas or an average value of reception powers of multiple antennas.

In the base station according to the first invention, if multiple terminals are destinations or sources of the signals transmitted or received in the n antennas, respectively, the target terminal may be replaced with a combination of multiple target terminals; and the power change management unit may be configured to manage the common power change amount and the individual power change amount for each of the combination of the multiple target terminals, using a minimum value of reception powers from the multiple terminals in one random antenna of the n antennas or an average value of minimum values of reception powers from the multiple terminals in multiple antennas, as the prescribed reception power.

In the base station according to the first invention, a configuration may be employed in which the common power change amount and the individual power change amount that are managed in the power change management unit are given from an external control apparatus.

In the base station according to the first invention, a configuration may be employed in which, due to the power changing of the signals transmitted or received in the n antennas, respectively, a rearrangement of a frequency channel is made in between base stations.

According to a second invention, there is a method of controlling a transmission or reception power in the base station according to the first invention, the method includes a step of causing the power change management unit to manage a common power change amount that is common to antennas, which corresponds to a prescribed reception power, and an individual power change amount that corresponds to a difference between a reception power of each antenna and the prescribed reception power, according to reception powers of signals received from each terminal to the n antennas, respectively; a step of causing the individual power notification unit to notify the power control unit in advance of the individual power change amount in accordance with the each terminal at a prescribed timing; a step of causing the common power notification unit to notify the power control unit of the common power change amount in accordance with a target terminal being a destination or source of the signal before the signals are transmitted or received in the n antennas, respectively; and a step of causing the power control unit to store the individual power change amount, which is notified in advance by the individual power notification unit, in a storage unit, and to perform control of power changing by the n power change units, using an amount of power change that results from adding up the common power change amount in accordance with the target terminal, which is notified from the common power notification unit, and the individual power change amount in accordance with the target terminal, which is read from the storage unit.

In the method of controlling the transmission or reception power in the base station according to the second invention, the power change management unit may use as the prescribed reception power, a reception power of one random antenna of the n antennas or an average value of reception powers of multiple antennas.

In the method of controlling the transmission or reception power in the base station according to the second invention, if multiple terminals are destinations or sources of the signals transmitted or received in the n antennas, respectively, the target terminal may be replaced with a combination of multiple target terminals; and the power change management unit may manage the common power change amount and the individual power change amount for each of the combination of the multiple target terminals, using a minimum value of reception powers from the multiple terminals in one random antenna of the n antennas or an average value of minimum values of reception powers from the multiple terminals in multiple antennas, as the prescribed reception power.

Effect

According to the present invention, a common power change amount for every target terminal and for every antenna is set in advance, and a common power change amount and an individual power change amount in the target terminal, which are notified each a signal is transmitted or received, are added up and thus a power control unit is controlled. Consequently, an amount of information of the notification signal that is transferred using a few control lines can be greatly reduced. As a result, although the number of antennas increases, it is possible that the time taken for power changing processing is shortened and thus starting of signal transmission or reception is advanced and that a high-speed signal is dealt with.

BRIEF DESCRIPTION OF THE DRAWINGS

FIG. 2 is a diagram for describing for a method of calculating a common power change amount and an individual power change amount according to the present invention.

FIG. 3 is a diagram illustrating an example of calculating the amount of power change for every target terminal according to the present invention.

FIG. 6 is a diagram for describing for a method of calculating the common power change amount and the individual power change amount in MU-MIMO.

FIG. 9 is a diagram illustrating a scheme for transfer of a notification signal.

DETAILED DESCRIPTION OF THE EMBODIMENTS

Figure 1:
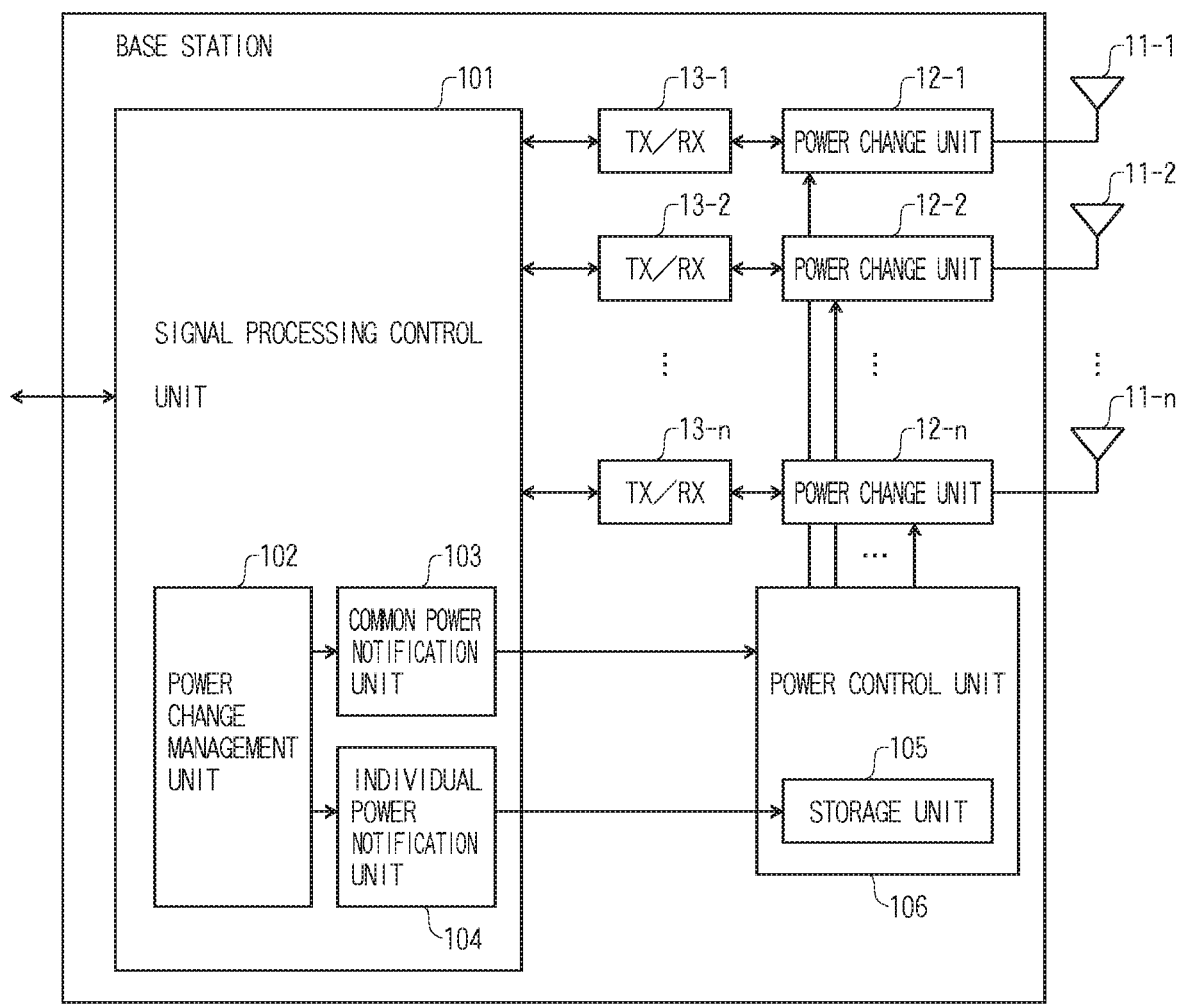
FIG. 1 is a diagram illustrating an example of a configuration of a base station according to the present invention.

FIG. 1 illustrates an example of a configuration of a base station according to the present invention.

In FIG. 1, the base station includes n (n is an integer of two or more) antennas, antennas 11-1 to 11-$n$. Power change units 12-1 to 12-$n$ change transmission powers and reception powers of signals that are transmitted or received in the antennas, respectively. Transmission and reception units 13-1 to 13-$n$ perform transmission processing and reception processing of signals that are transmitted or received in the antennas, respectively. A signal processing control unit 101 performs conversion processing of a signal that is input and output into and from a network that is connected to the base station and a signal that is transmitted or received in each antenna. For management, a power change management unit 102 divides an amount of power change, which is set to be in the power change units 12-1 to 12-$n$, into a common power change amount, which is for every target terminal that is a destination or source of a signal that is transmitted or received in each antenna, and which is common to the antennas, and an individual power change amount, which is for every target terminal and for every antenna. A common power notification unit 103 notifies a power control unit 106 of the common power change amount in accordance with the target terminal before the transmission or reception processing of the signal. An individual power notification unit 104 notifies the power control unit 106 of the individual power change amount that is set in advance at a prescribed timing different from that in the transmission or reception processing of the signal. The power control unit 106 stores the individual power change amount in a storage unit 105, and performs control that changes powers of the power change units 12-1 to 12-n, conforming with the common power change amount and the individual power change amount in accordance with the target terminal that is the destination or source of the signal.

The common power change amount and the individual power change amount in accordance with the target terminal are described here. The amount of power change that is set to be in the power change units 12-1 to 12-n is a value of a difference between a reception power (RSSI) of each of the antennas 11-1 to 11-n for every target terminal and a prescribed threshold (for example, −60 dBm), and changes each time the signal is transmitted or received. However, a value of a difference in the reception power between the antennas for every target terminal can be regarded as being almost fixed during a certain fixed period of time.

According to the present invention, a value of a difference in the reception power between a reception power of one reference antenna that is among multiple antennas and a prescribed threshold is assumed to be the common power change amount, and a value of a difference between a reception power of the reference antenna and a reception power of any one antenna is assumed to be the individual power change amount. Consequently, the value of the difference between the reception power of each antenna and the prescribed threshold is a sum of the common power change amount and all of individual power change amounts for the respective antenna, and this is the amount of power change that is set to be in the power change units 12-1 to 12-n. It is noted that, instead of the reception power of the reference antenna, a value of a difference between an average value of reception powers of multiple antennas and the prescribed threshold may be used in calculating the common power change amount.

In an example that is illustrated in FIG. 2, a signal from a terminal 20-1 illustrates a reception power that is received in the antennas 11-1 to 11-n. However, it is assumed that an amount of attenuation in accordance with a length of a cable between each antenna and the power change unit is included in the reception power. First, it is assumed that the antenna 11-1 is selected here as one reference antenna that is among the antennas, that a difference value of +10 dB between a reception power of −50 dBm and a threshold of −60 dBm is calculated, and that the common power notification unit 103 sets the calculated difference value of +10 dB to be the common power change amount that is notified to the power control unit 106. Moreover, it is assumed that difference values of +10 dB and so forth up to −5 dB between the reception power of the reference antenna 11-1 and the reception powers of the other antennas 11-2 and so forth 11-n are calculated, and that the calculated difference values are set to be the amounts of individual power change that are to be stored by the individual power notification unit 104 in the storage unit 105. As an example of the common power change amount and the individual power change amount for every terminal that is a destination is illustrated in (1) of FIG. 3.

The common power change amount changes each time a signal is transmitted or is received, but the individual power change amount is almost fixed for a certain period of time, and because of this, can be retained, as prior information, in the storage unit 105. Consequently, if only the common power change amount in accordance with a reception power of the target terminal each time a signal is transmitted or received is notified by the common power notification unit 103 to the power control unit 106, individual power change information that corresponds to each antenna in accordance with the target terminal, which is retained in the storage unit 105, is read in the power control unit 106 for addition. Accordingly, as is illustrated in (2) in FIG. 3, amounts of power change in the power change units 12-1 to 12-n can be generated. It is noted that positive and negative amounts of power change are attenuation and amplitude here.

In this manner, the amounts of individual power change for every target terminal and for every antenna may be kept stored in advance in the storage unit 105, and the common power change amount in accordance with the target terminal each time a signal is transmitted or received may be notified to the power control unit 106. Because of this, an amount of information of the notification signal can be greatly reduced. As a result, although the number of antennas increases, it is possible that the time taken for power changing processing is shortened and thus starting of signal transmission or reception is advanced and that a high-speed signal is dealt with.

Figure 4:
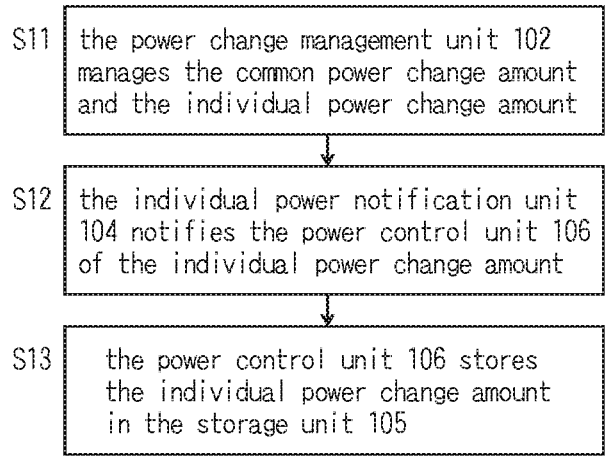
FIG. 4 is a flowchart illustrating a procedure for prior setting of the individual power change amount in the base station according to the present invention.

FIG. 4 illustrates a procedure for prior setting of the individual power change amount in the base station according to the present invention.

In FIG. 4, the power change management unit 102 of the base station calculates using the reception power of each antenna through the use of a calculation method that is illustrated in FIG. 2, and for management, divides the amount of power change, which is set to be in the power change units 12-1 to 12-n, into the common power change amount, which is for every target terminal that is a destination or source of a signal that is transmitted or received in each antenna, and the individual power change amount, which is for every target terminal and for every antenna (S11). The individual power notification unit 104 notifies the power control unit 106 of the individual power change amount that is set in advance at a prescribed timing different from that in the transmission or reception processing of the signal (S12). The power control unit 106 stores the notified individual power change amount in the storage unit 105 (S13). Furthermore, if the individual power change amount is updated in the power change management unit 102, the updated individual power change amount is again notified by the individual power notification unit 104 to the power control unit 106, and the notified individual power change amount is stored in the storage unit 105.

Figure 5:
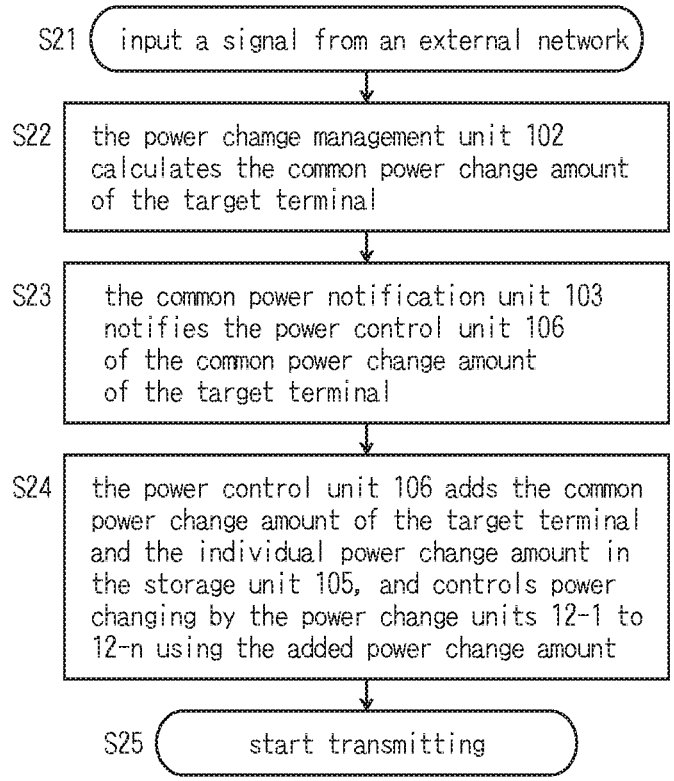
FIG. 5 is a flowchart illustrating a procedure for signal transmission by the base station according to the present invention.

FIG. 5 illustrates a procedure for signal transmission in the base station according to the present invention.

In FIG. 5, when a signal that is transmitted from an external network to the target terminal is input (S21), the signal processing control unit 101 of the base station extracts the target terminal that is a destination of the transmitted signal and notifies the power change management unit 102 of the extracted target terminal, and the power change management unit 102 calculates the common power change amount that corresponds to the target terminal and outputs the calculated common power change amount to the common power notification unit 103 (S22). The common power notification unit 103 notifies the power control unit 106 of the common power change amount in accordance with the target terminal (S23). The power control unit 106 calculates the amount of power change that results from adding up the common power change amount in accordance with the target terminal and the individual power change amount in accordance with the target terminal, which is read from the storage unit 105, and controls power changing by the power change units 12-1 to 12-n using the calculated amount of power change (S24). The power change units 12-1 to 12-*n* complete the power changing and then transmit a signal (S25).

In a procedure for signal reception by the base station according to the present invention, steps that are to be performed after the signal processing control unit 101 ends signal transmission and then the power change management unit 102 determines the amounts of power change by the power change units 12-1 to 12-*n*, which are for reception, are the same as Steps S22 to S24 in the procedure for signal transmission. Then, the power changing by the power change units 12-1 to 12-*n* is completed and then a signal waits to be received. The procedure for reception is ready to be executed. It is noted that, as the common power change amount and the individual power change amount for reception, the common power change amount and the individual power change amount that correspond to the target terminal that is used for transmission power control that is illustrated in (1) of FIG. 3 can be used.

The common power change amount and the individual power change amount in the transmission power and the reception power for every the target terminal, which are described above are available when one terminal is assumed to be a destination, and if multiple terminals are assumed to be destinations in MU-MIMO communication, the common power change amount and the individual power change amount are used for each of the combinations of terminals, such as a combination of a second terminal, a third terminal, a fourth terminal, and so forth, which are destinations.

FIG. 6 illustrates a method of calculating the common power change amount and the individual power change amount in MU-MIMO. (1) of FIG. 6 is an example of calculation of the common power change amount and the individual power change amount for a combination of two terminals, terminals 20-1 and 20-2. Signals from the terminals 20-1 and 20-2 illustrate reception powers that are received in the antennas 11-1 to 11-*n*, respectively. However, it is assumed that an amount of attenuation in accordance with a length of a cable between each antenna and the power change unit is included in the reception power. First, when a minimum value of the reception power in each antenna is calculated, the minimum value in the antenna 11-1 is −55 dBm that is the reception power from the terminal 20-2. This is hereinafter the same. Next, it is assumed that the antenna 11-1 is selected here as one reference antenna that is among the antennas, that a difference value of +5 dB between a minimum reception power of −55 dBm and a threshold of −60 dBm is calculated, and that the calculated difference value of +5 dB is set to be the common power change amount that is to be notified by the common power notification unit 103 to the power control unit 106. Moreover, it is assumed that difference values of +5 dB and so forth up to +10 dB between the minimum reception power of the reference antenna 11-1 and the minimum reception powers of the other antennas 11-2 and so forth 11-*n* are calculated, and that the calculated difference values are set to be the amounts of individual power change that are to be stored by the individual power notification unit 104 in the storage unit 105. As described above, the common power change amount and the individual power change amount for a combination of the base stations 20-1 and 20-2 are obtained.

(2) of FIG. 6 is an example of the calculation of the common power change amount and the individual power change amount for a communication of three terminals, terminals 20-1, 20-2, and 20-3, and the common power change amount and the individual power change amount are calculated in the same manner as for the combination of two terminals that are illustrated in (1) of FIG. 6.

Figure 7:
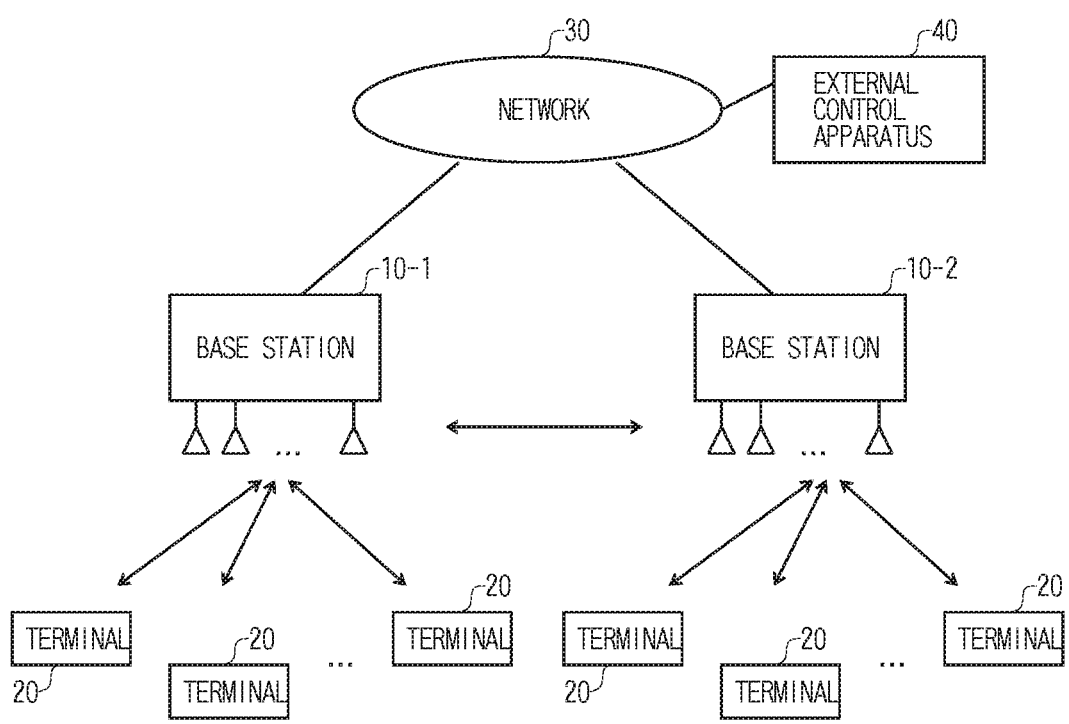
FIG. 7 is a diagram illustrating an example of a configuration of a wireless communication system that is assumed according to the present invention.
Figure 8:
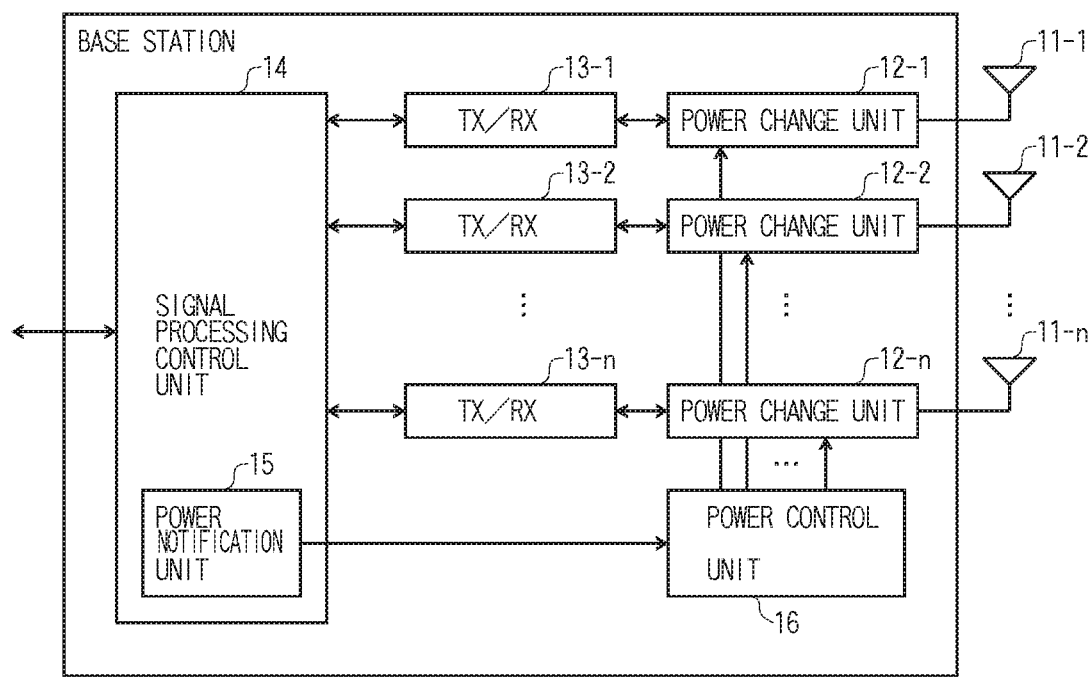
FIG. 8 is a diagram illustrating an example of a configuration of a base station in the related art.

Incidentally, in an external control apparatus (40 in FIG. 7) that is connected to a network, a configuration may be employed in which reception power information may be collected for every terminal, which is received in each of the antennas 11-1 to 11-*n* of the base station, in which the calculations of the common power change amount and the individual power change amount for every target terminal or for every combination of target terminals are performed instead of the power change management unit 102, and in which the calculated amounts are notified to the power change management unit 102.

Furthermore, in the external control apparatus that is connected to a network (40 in FIG. 7), RSSI information that is owned by each base station (the base station 10-1 or 10-2 in FIG. 7), between the base station itself and a neighboring base station, and the common power change amount and the individual power change amount, which are calculated in each base station may be collected, and, based on these pieces of information, the external control apparatus may perform control that designates a frequency channel in each base station. An example of a procedure for designating the frequency channel will be described below.

(1) The amount of power change that results from adding up the common power change amount and the individual power change amount for every antenna is calculated. As power information that is used here, an average value of the common power change amount and the individual power change amount for every terminal, or a minimum value of them, is used. Alternatively, the common power change amount and the individual power change amount for a specific terminal or a combination of specific terminals are used.

(2) An average value of, or a total value of, the calculated amounts of power change for every antenna is calculated.

(3) The average value or the total value that is calculated in (2) is subtracted from the RSSI information which is collected, between the base station itself and a neighboring base station.

(4) Allocation of the frequency channel is redetermined using the post-subtraction RSSI information. One of a method of minimizing the RSSI, a method of maximizing minimum throughput, other general methods of allocating the frequency channel, and the like is selected as a method of determining the frequency channel.

(5) The redetermined frequency channel is notified to each base station.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to exact construction and operation illustrated and described, and accordingly all suitable modifications and equivalents may be resorted to, falling within the scope thereof.

The invention claimed is:

1. A base station in a wireless communication system in which the base station and one or more terminals share the same frequency channel, the base station comprising:
   n antennas, where n is an integer of two or more;
   n power change units changing transmission powers or reception powers of signals transmitted or received in the n antennas, respectively;

a power control unit performing control of power changing by the n power change units;

a power change management unit managing a common power change amount that is common to the antennas, which corresponds to a prescribed reception power, and an individual power change amount that corresponds to a difference between a reception power of each antenna and the prescribed reception power, according to the reception powers of the signals received from each terminal to the n antennas, respectively;

a common power notification unit notifying the power control unit of the common power change amount in accordance with a target terminal being a destination or source of a signal before the signals are transmitted or received in the n antennas, respectively; and an individual power notification unit notifying the power control unit in advance of the individual power change amount in accordance with the each terminal at a prescribed timing, wherein the power control unit is configured to store the individual power change amount, which is notified in advance by the individual power notification unit, in a storage unit, and to perform control of power changing by the n power change units, using an amount of power change that results from adding up the common power change amount in accordance with the target terminal, which is notified from the common power notification unit, and the individual power change amount in accordance with the target terminal, which is read from the storage unit.

2. The base station according to claim 1, wherein the power change management unit is configured to use as the prescribed reception power, one of a reception power of one random antenna of the n antennas and an average value of reception powers of multiple antennas.

3. The base station according to claim 1, wherein:

if multiple terminals are destinations or sources of the signals transmitted or received in the n antennas, respectively, the target terminal is replaced with a combination of multiple target terminals; and the power change management unit is configured to manage the common power change amount and the individual power change amount for each of the combination of the multiple target terminals, using one of a minimum value of reception powers from the multiple terminals in one random antenna of the n antennas and an average value of minimum values of reception powers from the multiple terminals in multiple antennas, as the prescribed reception power.

4. The base station according to claim 1, wherein a configuration is employed in which the common power change amount and the individual power change amount that are managed in the power change management unit are given from an external control apparatus.

5. The base station according to claim 1, wherein a configuration is employed in which, due to the power changing of the signals transmitted or received in the n antennas, respectively, a rearrangement of a frequency channel is made in between base stations.

6. A method of controlling a transmission or reception power in the base station according to claim 1, the method comprising:

a step causing the power change management unit to manage a common power change amount that is common to antennas, which corresponds to a prescribed reception power, and an individual power change amount that corresponds to a difference between a reception power of each antenna and the prescribed reception power, according to reception powers of signals received from each terminal to the n antennas, respectively;

a step causing the individual power notification unit to notify the power control unit in advance of the individual power change amount in accordance with the each terminal at a prescribed timing;

a step causing the common power notification unit to notify the power control unit of the common power change amount in accordance with a target terminal being a destination or source of the signal before the signals are transmitted or received in the n antennas, respectively; and a step causing the power control unit to store the individual power change amount, which is notified in advance by the individual power notification unit, in a storage unit, and to perform control of power changing by the n power change units, using an amount of power change that results from adding up the common power change amount in accordance with the target terminal, which is notified from the common power notification unit, and the individual power change amount in accordance with the target terminal, which is read from the storage unit.

7. The method of controlling the transmission or reception power in the base station according to claim 6, wherein the power change management unit uses as the prescribed reception power, one of a reception power of one random antenna of the n antennas and an average value of reception powers of multiple antennas.

8. The method of controlling the transmission or reception power in the base station according to claim 6, wherein:

if multiple terminals are destinations or sources of the signals transmitted or received in the n antennas, respectively, the target terminal is replaced with a combination of multiple target terminals; and the power change management unit manages the common power change amount and the individual power change amount for each of the combination of the multiple target terminals, using one of a minimum value of reception powers from the multiple terminals in one random antenna of the n antennas and an average value of minimum values of reception powers from the multiple terminals in multiple antennas, as the prescribed reception power.

* * * * *